United States Patent [19]

Russell et al.

[11] 4,289,987
[45] Sep. 15, 1981

[54] MAGNETOSTRICTIVE NON-CONTACTING PRESSURE DETECTION SYSTEM

[75] Inventors: James T. Russell; Thomas J. Davis, both of Richland, Wash.

[73] Assignee: Exxon Nuclear Company, Inc., Bellevue, Wash.

[21] Appl. No.: 773,771

[22] Filed: Mar. 2, 1977

Related U.S. Application Data

[63] Continuation of Ser. No. 558,124, Mar. 13, 1975, abandoned.

[51] Int. Cl.³ ............................................. H01L 41/14
[52] U.S. Cl. ......................................... 310/26; 73/728; 176/80
[58] Field of Search ...................... 310/26; 73/398 R; 176/80

[56] References Cited

U.S. PATENT DOCUMENTS

| | | | |
|---|---|---|---|
| 2,376,156 | 5/1945 | Kuehni | 73/398 R X |
| 2,887,882 | 5/1959 | Richter | 73/398 R |
| 3,229,524 | 1/1966 | Jewell | 73/398 R |
| 3,940,992 | 3/1976 | Jost et al. | 73/398 R |
| 3,958,558 | 5/1976 | Dunphy et al. | 73/398 R X |
| 4,011,758 | 3/1977 | Reenstra et al. | 73/398 R X |
| 4,014,319 | 3/1977 | Faure | 73/398 R X |

Primary Examiner—Mark O. Budd
Attorney, Agent, or Firm—R. D. Hantman; F. D. Paris

[57] ABSTRACT

A system including a sensor and electronic instrumentation for measuring fission gas pressures inside a pressurized system or device or the like, such as a nuclear fuel rod. The system is based primarily on what is commonly known as the Villari effect which is the dependence of the magnetic permeability of certain magnetic materials upon applied stress, and permits pressure measurements to be made without any mechanical or physical penetration of the fuel cladding or end cap of the fuel rod. In a preferred embodiment pressure sensing is implemented by locating a sensor made from Villari sensitive material inside the pressurized system. The pressure places a stress loading on the sensor which in turn produces electrical output signals proportional to the applied stress. By sensing the initial magnetic permeability of the sensor, the difference between that sensed information and subsequently sensed similar information can be obtained, thereby providing an indication of any change in system pressure and the degree of such change. Such measurements can be made sequentially at multiple locations by placing an external electromagnetic search coil adjacent the internal sensor in the pressurized system such that the magnetic field of the search coil penetrates the containment wall of the pressurized system, thus interrogating the sensor and providing an appropriate readout which can be calibrated in terms of system pressure.

9 Claims, 5 Drawing Figures

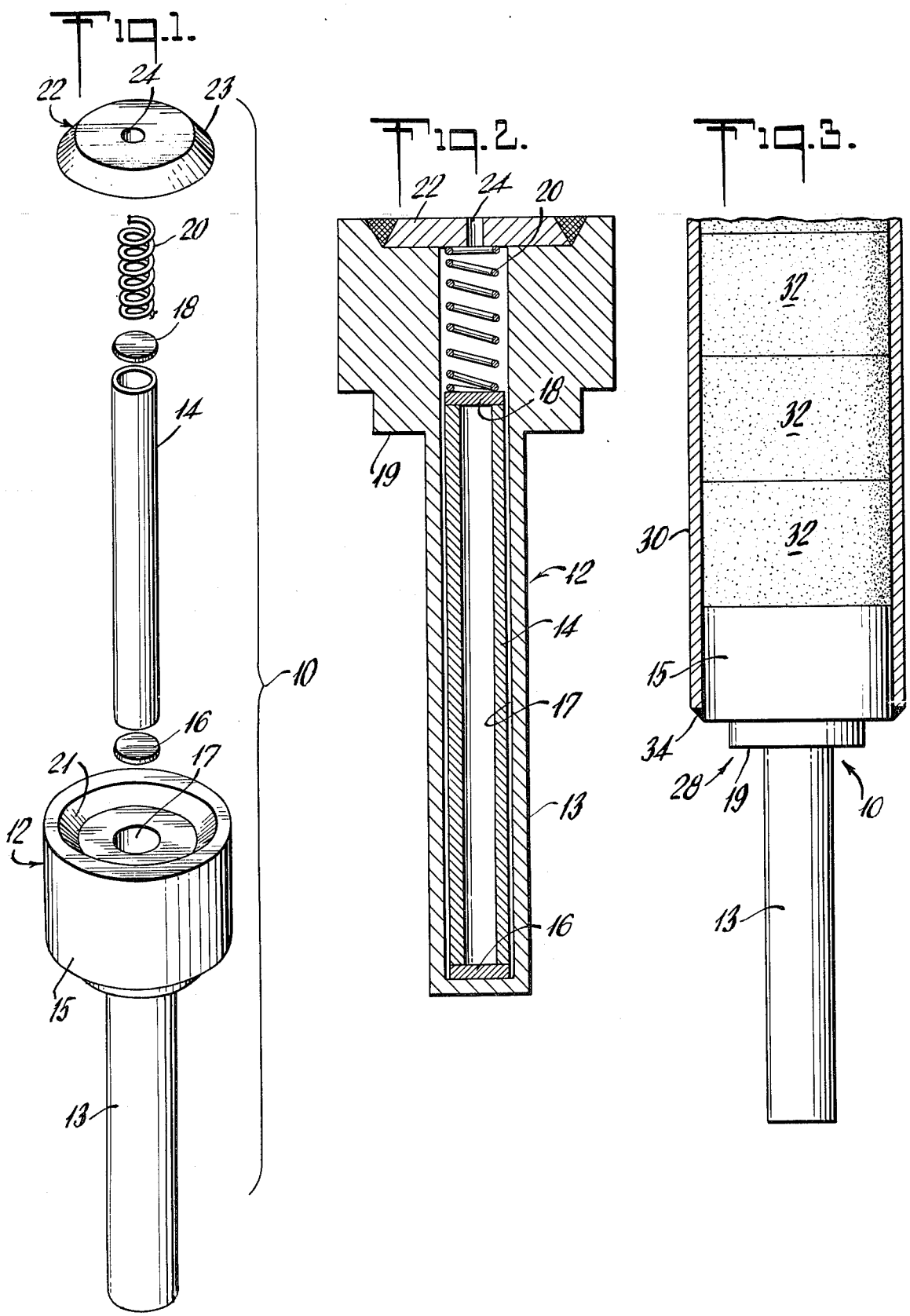

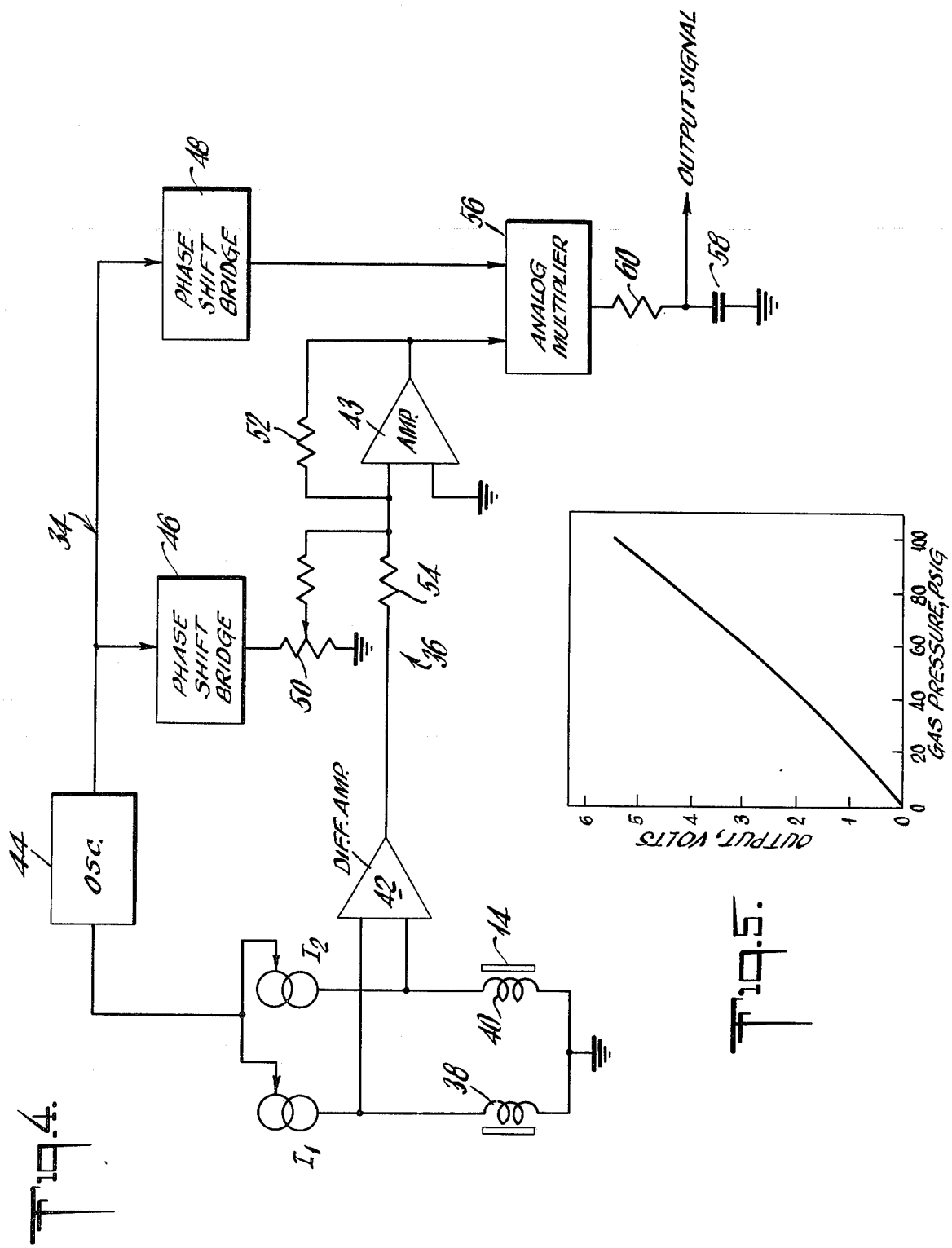

MAGNETOSTRICTIVE NON-CONTACTING PRESSURE DETECTION SYSTEM

This is a continuation of application Ser. No. 558,124, filed Mar. 13, 1975, now abandoned.

BACKGROUND OF THE INVENTION

When a pressurized containment system is used it is often times desirable and sometimes necessary to have information of the pressure within such a system. This is particularly true in the case of nuclear reactor fuel rods where such pressure measurements are desirable in order to detect a possible leak in the fuel rod or to determine the status of the fuel within the rod. In the case of nuclear reactors these measurements may be made while the rods are in the fuel assemblies which are utilized in the reactor and it must be possible to measure all of the rods. To be acceptable in the nuclear field the measurement technique for pressure determination must be radiation-proof and be capable of withstanding the high operating temperatures of the reactor. Such a technique also must be self-calibrating, or at least self-checking or fail-proof and insensitive to changes in the outside surface of the rod. There can be a severe economic penalty if the pressure measurement is not accurate, since a low pressure indication would cause what would actually be a good fuel bundle to be discarded, while a high pressure readout where the rod was actually failed could result in release of radiation to the environment. Other fields where such a pressure measurement system may be desirable are those which use highly corrosive chemical vessels and high pressure, high integrity systems.

It is apparent then that there is a very real need for a pressure detection system which can function without the need for any mechanical or physical penetration of the pressurized system, while still obtaining the desired internal pressure measurement. The prior art pressure sensing techniques such as the differential balance system where small tubing penetrates the pressurized system, is pressurized, and connected to a differential gage; and the techniques which use a capacitive diaphragm or a bellows device, have proven relatively unsatisfactory, since they require expensive internal installation costs and tend to develop leaks through the relatively thin diaphragm.

SUMMARY OF THE INVENTION

Basically, the present invention relates to a pressure measurement system including a transducer or sensor and electronic instrumentation, particularly for measuring gas pressure inside a pressurized system and more particularly for measuring fission gas pressure inside individual nuclear fuel rods, while the rods are located in a fuel bundle within a nuclear reactor. The present system makes use of primarily the well-known Villari effect to perform pressure measurements without any mechanical or physical penetration of the fuel rod cladding or end cap. The system will respond to pressure changes as small as about 1 psi, and has a measurement capability of about 0 to 500 psi, although the range obviously can be extended with relatively minor modifications which will be within the skill of those working in the art once they have knowledge of the present invention. The present system requires very minimal and inexpensive modifications to employ it in existing fuel rod fabrication techniques and can be easily deployed in a nuclear fuel reactor with relatively little effort. While in the preferred embodiment the system specifically is disclosed for measuring fission gas pressure in a nuclear fuel rod, it is generally applicable to virtually any sealed pressurized system which has a pressure measurement requirement.

The pressure measurement can be made at a plurality of locations by taking sequential measurements at each fuel rod. The measurements are made by placing an external electromagnetic search coil adjacent or proximate a sensor which is located internally of the fuel rod preferably near an accessible end thereof. The search coil is energized to develop an a-c magnetic field which penetrates the metallic pressure containment wall and tests the magnetic properties of the sensor. The use of the Villari effect is essentially relying upon the dependence of the magnetic permeability (of the sensor) upon applied stress (pressure of the system). This effect is associated with the crystal or grain structure of the particular material employed so that the magnitude and the sign (negative or positive) of the change in permeability is a function of orientation of the grain. The sensor made from a Villari effect material, such as a nickel ferrite or nickel alloy, is located inside the pressurized system such that the pressure within the system creates a stress loading on the sensor. Changes in the initial or virgin permeability of the sensor due to the pressure loading are detected by the search coil located externally of the pressurized system but sufficiently close to sense changes in sensor permeability and are read out as pressure levels in a suitable instrument.

Typically, a sensor according to this invention would comprise a sealed hollow cylinder or sphere made of material such a N-50 ferrite (approximately 50% nickel oxide) which is a low temperature coefficient magnetostrictor commercially available from Ceramic Magnetics of Fairfield, N.J. The Villari effect, which is a basic magnetostrictive effect, in the case of the N-50 ferrite exhibits a very high degree of sensitivity to applied pressure provided that proper stress loading is achieved. Proper loading requires that the internal volume of the sensor be sealed against pressure and that the wall of the sensor be thin enough to obtain reasonable compressional stress at its outer surface. Surface stress is required because electromagnetic energy from the interrogation coil penetrates to only a very shallow depth below the surface of the sensor. Typical dimensions for the sensor would include an outside diameter of 0.125 inches, an inside diameter of 0.075 inches, and length of 1 inch.

The electronic portion of the pressure detecting system which will be described in detail hereinafter, basically comprises a dual coil eddy current instrument with phase sensitive discrimination and specifically designed for precisely measuring permeability. The coils comprise a reference coil and a detector coil, the latter of which is located close to the sensor during operation of the system. The resultant voltages produced by each of the coils is a product of current and impedance of each coil and, therefore, is directly proportional to impedance. The coil voltages then are applied to a differential amplifier whose output voltage is summed with a second voltage having adjustable amplitude and phase. The adjustability of this second voltage permits obtaining a null balance. This balance is obtained by adding the sum of the coil voltages to the second voltage which is equal to but 180° out of phase with the sum of the coil output voltage. By doing this, amplification of the signals is permitted without overdriving, that is without saturating the amplifiers. The output from the summation amplifier and the reference voltage signal are applied to a standard analog multiplier which operates as a phase sensitive ac-to-dc converter. The dc output of the multiplier is proportional to the amplitude of the two inputs and the cosine of the angle between them. The phase of the reference signal, which is adjustable, establishes the detection axis (i.e. the sign of positive pressure). The output of the multiplier which can be calibrated directly in terms of pressure then is connected to drive a suitable meter or recorder or other such readout device.

The foregoing described pressure detection instrument operates basically by measuring the vector impedance of the search or interrogation coil when it is placed over or near the sensor. The instrument employs an impedance measurement technique which is similar to that used in conventional instruments, and the coils are driven at suitable frequency, e.g. 1-2 KHz, to insure penetration of metal walls in the pressurized system. Temperature compensation is provided by employing a second sensor in operable association with the reference coil. The second sensor is maintained at ambient pressure but is relatively close to the detection sensor so as to be at the same temperature which results in a cancellation of any temperature changes.

Thus, it is apparent that it is an object of this invention to provide a pressure detection system for measuring the pressure of a pressurized system without mechanical penetration thereof and which system responds to relatively small changes in pressure and has a substantially wide measurement range.

Having in mind the foregoing objects that will be evident from an understanding of this disclosure, the invention comprises the combination arrangements and devices as demonstrated in the presently preferred embodiment of the invention which is hereinafter set forth in such detail as to enable those skilled in the art readily to understand the function, operation, construction and advantage of it when read in conjunction with the accompanying drawings.

BRIEF DESCRIPTION OF THE DRAWINGS

FIG. 1 is an exploded perspective view of a preferred embodiment of the pressure transducer according to the present invention;

FIG. 2 is a cross-sectional view in elevation of the pressure transducer of FIG. 1 in assembled relationship;

FIG. 3 is an elevational view of the pressure transducer of FIGS. 1 and 2 according to the present invention assembled in a nuclear fuel rod;

FIG. 4 is a schematic diagram of the electronics of a pressure detection instrument according to the present invention; and FIG. 5 is a response of a typical system constructed according to the present invention.

DESCRIPTION OF THE PREFERRED EMBODIMENT

As shown in FIG. 1, there is illustrated a pressure transducer generally designated 10 in the form of an end plug or cap 12 for a nuclear reactor fuel rod element 28 (see FIG. 3). The end plug 12 comprises a hollow elongated cylindrical end cap shank 13 sealed permanently at one end and at the opposite end having an integral enlarged cylindrical portion 15 with the central bore 17 extending from the sealed end of and through the shank 13 and the enlarged cylindrical portion 15, as shown in FIG. 2. The end plug 12 receives an elongated magnetostrictor sensor 14 in the bore 17, which although shown as a single or unitary elongated tubular member also may comprise a plurality of relatively shorter individual tubular members. The sensor is sealed at opposite ends by means of end caps 16 and 18 and is designed to be received within the hollow portion 17 of the plug 12. A typical material used for the sensor 14 is N-50 ferrite, which is a low temperature coefficient magnetostrictor that exhibits the desired properties for responding to applied stress. For the sensor it is desired to have any one of a number of materials which are characterized by having a dependence of magnetic permeability on applied stress and resistant to radiation damage. Suitable materials include certain nickel ferrites and selected nickel alloys. The preferred material, a magnetostrictive ferrite, was found to be satisfactory for purposes of this invention. Preferably the sensor should be about 1.5 inches long in order to avoid any edge effects that is, the search coil should be as close as possible to the center of the sensor. It has been found that an open-ended hollow sensor or a solid sensor would not be as satisfactory as the sealed tubular sensor of this invention in terms of sensitivity. As previously discussed, adequate sensitivity requires compressional rather than shear stress loading in the area of the sensor being interrogated by the search coil. It has been found that this stress can best be achieved with the sealed tubular configuration.

A suitable way of sealing the ferrite end caps 16 and 18 to the sensor 14 is to seal them with molten glass before final sintering. A substantial amount of glass normally is used as a binding agent in fabrication of ferrite sensor so that no new material is introduced when the end caps are sealed in place. Although it has been suggested to use molten glass for sealing the end caps to the sensor, any suitable cementing technique will suffice. In the case of fission gas sensors such as used in the preferred embodiment, the technique used is particularly important since the sealing agent (e.g., glass) has to withstand reactor irradiation. A disadvantage of sealing the sensor, however, is that cooling from sintering temperature will create a vacuum in the sensor necessitating a small hole in one of the end caps 16 or 18 for pressure equalization. However, this equalization hole (not shown) could subsequently be sealed by various methods which would not cause reheating of the internal gas volume, which would be within the skill of those working in the art.

FIG. 3 illustrates the assembled end plug with sensor located inside and operatively connected to the nuclear fuel rod 28 having a metal casing 30 and fuel elements 32 disposed therein. The end plug 12 can be welded as shown in 34 to the fuel rod casing 30. It should be recognized, however, that while shown in connection with a gas pressure system such as a nuclear fuel rod, the present invention also can be used in other instances such as measurement of small differential pressures inside a high-pressure, thick-walled vessel. It is also desirable in order to obtain repeatability of the measurement, for the sensors to be identically located in each end cap of a fuel rod. Another requirement for repeatability is for precise location of the search coil along the length axis of the sensor. This can be accomplished by providing an index on the shoulder 19 of the fuel end cap 12 against which the base of the coil form is abutted before taking any measurement. With the sensor 14 located primarily in the hollow end cap shank 13, a positioning helical spring 20 is inserted into the bore 17, whereupon a zircaloy retaining cap 22 having a central pressure opening 24 is welded into place at the bottom of the end plug 12. The outwardly beveled rim 21 of the cylindrical portion 15 complements the beveled sides 23 of the retaining end cap 22 to provide a groove for welding the retaining cap 22 to end plug 15.

The preferred sensor construction provides a sealed inner volume of air or other suitable gas at atmospheric pressure. While the internal pressure will vary with temperature, this will be of no consequence as temperature compensation (to be discussed in further detail hereinafter) is provided by means of a second reference sensor. The desired effect which is the increase or decrease in compressional or tensional stress at the surface of the sensor upon pressurization thereof is achieved substantially irregardless of the internal pressure of the sensor.

Turning now to FIG. 4, which illustrates a block diagram of the pressure detection instrument including its associated electronics, there is schematically shown the Villari effect sensor element 14 which in actual practice for the preferred embodiment would be found within the end cap of the nuclear fuel rod as previously disclosed. Specifically, the system includes a dual-coil eddy current instrument having multi-channels 34, 36 including one which provides phase sensitive discrimination. A reference coil 38 is employed in conjunction with a reference transducer shown at 40, which is maintained at ambient pressure and temperature. This reference coil 38 when taken with the sensor coil 40 will provide suitable temperature compensation for the system as discussed in detail below. The use of phase sensitive discrimination allows monitoring of energy aligned with the permeability axis (i.e., pressure information) while any signals corresponding to conductivity or coil wire resistance changes essentially can be discarded because they are not needed. By way of example, coils which have been found suitable for use in the present invention have comprises 312 turns of No. 31 copper wire wound on a 0.300 O.D. coil form, with a length of 0.375 inches, and an inside diameter of about 0.25 inches. One requirement of the search or sensor coil 40 is that it be substantially smaller in its axial or longitudinal direction than the length of the sensor slug 14, in order to avoid sensitivity to positioning of the coil along the slug. If the axial length of the coil were longer, end effects would become significant.

The sensor coil will be sensitive to the type of material which it is placed adjacent to. Thus, when the coil is placed over the zircaloy shank of the end cap in the preferred embodiment, there will be a small increase in coil resistance at a constant reactance, whereas ferrite alone would cause a large increase in reactance at a constant resistance. When the coil, however, is placed over a composite sensor such as in the presently disclosed embodiment (a ferrite sensor under a zircaloy enclosure), there is an increase in both resistance and reactance. In this case a change in ferrite (the sensor 14) permeability produces a sensor coil impedance which is at approximately a 30° angle relative to the resistance of the X axis, as compared to the normally anticipated 90° directional change for a change only in coil reactance. The instrument can be adjusted by the rotation control (phase shift bridge 48) to detect impedance changes along this locus (i.e., the 30°) or along either of the X or Y coordinate axes. In practice, however, it is preferable to read only the reactive or 90° component of the coil vector so that the measurement will not be sensitive to variations in conductivity and therefore resistance of the coil. This procedure will provide for a more than adequate sensitivity as shown from a typical response of a prototype shown in FIG. 5. Each of the coils 38 and 40 are driven e.g. at a 2 KHz frequency by suitable constant current sources $I_1$ and $I_2$. The resultant coil voltages comprise the product of current and impedance and therefore is directly proportional to impedance. The output coil voltages are applied to a conventional differential amplifier 42 where they are summed. The output voltage from differential amplifier 42 is then applied to a further amplifier 43 to which is also applied a further voltage whose amplitude and phase is adjustable and which is derived as discussed hereafter. An oscillator 44 of the LC feedback type or other similar conventional circuit powers the coil drivers $I_1$ and $I_2$, and also the phase shift bridges 46 and 48. These bridges essentially have unity gain and provide signals having adjustable phase angle for driving the balance circuity 50, 43, and the phase sensitive discriminator 56, 60, 58. The output signal of bridge 46 can be adjusted by means of the amplitude balance control 50 which comprises a potentiometer.

This results in being able to make the second voltage applied to amplifier 43 equal in amplitude but opposite in phase by 180° to the resultant coil voltage applied from the output of amplifier 42. This produces a nulled signal at the output of amplifier 43. The null balancing of coil signals permits large amplification so as to obtain sensitivity to pressure without overdriving the amplifiers by applying excessive amplitude signals. Resistors 52 and 54 establish the voltage gain of amplifier 43. The bridge 48, also driven by oscillator 44, produces an output reference signal whose phase is adjustable by means of a suitable control on the instrument. By adjusting the phase, the detection or readout axis is determined as seen from the following discussion. The output from summation amplifier 43 is applied to analog multiplier 56 and low pass filter 60, 58, which combination operates as a phase sensitive ac-to-dc converter. The dc output across capacitor 58 is proportional to the amplitudes of the input signals received from channel 36 (amplified and balanced coil signals) and the reference signal from conventional phase shift bridge 48, and also to the cosine of the angle between them. When adjusting the phase of the reference signal control (bridge 48) in order to establish the appropriate detection axis, it is preferable to set it so that the readout from converter 56, 60, 58 is along the reactance on 90° axis, whereby the output responds only to changes in sensor coil reactance. To accomplish this the reference signal angle should be set so that coil resistance changes have no effect on converter output. The output from converter 56, 60, 58 can be calibrated to provide a readout directly in terms of pressure by driving a suitable meter, recorder or other similar readout device.

FIG. 5 illustrates response of typical prototype system according to this invention. This data was taken when nitrogen gas was used to pressurize an end cap with a sensor pursuant to the present invention. While a non-linear response is shown, this does not present significant problems for monitoring nuclear fuel rod pressure since the system transfer function would be determined beforehand. By optimizing the design of the sensor 14 (that is, proper selection of materials and shape) the response could be made linear. The frequency at which measurements were made was 2 KHz.

To measure the fission gas pressure of the fuel rod the search coil first is calibrated with a standard calibration transducer. This is done by turning on instrument power and placing both search and reference coils over transducers maintained at ambient pressure. The meter then is adjusted for zero readout and the angle of the discriminator is adjusted by appropriate control so that there is no change in readout when a small resistor (2-10 ohms) is momentarily inserted in series with the search coil by means of an unshorting switch. The reference transducer is pressurized to ambient conditions, and the search or sensor coil is removed and placed over the fuel end cap to measure fission gas pressure. The reference transducer and its associated coil then are located in proximity to the search coil in order to provide the desired temperature compensation which is obtained since both transducers are at approximately the same temperature. The fuel bundles would be removed from the reactor and transferred to a holding basin. There the pressures in the room would be measured as indicated above.

While a particular embodiment of the invention has been shown and described and various modifications thereof have been suggested, it will be understood that the true spirit and scope of the invention is set forth in the appended claims which embrace other modifications and embodiments which will occur to those of ordinary skill in the art.

Having thus set forth the nature of the invention, what we claim herein is:

1. A pressure measurement system comprising a pressurized system including a sensor located within said pressurized system comprising a material which has a magnetic permeability which is dependent upon stress applied thereto, and is responsive to the internal pressure of said pressurized system, sensing means operably associated with said pressurized system in proximate relation to said sensor within said pressurized system for developing a magnetic field upon energization which field penetrates the containment wall of said pressurized system and interrogates said sensor, said sensing means providing an output electrical signal which is proportional to the stress applied to said sensor, electronic circuit means connected to said sensor means for processing said output signal of said sensing means for providing a readout of said pressure in said pressurized system, and a reference sensing means located substantially close to said sensing means during energization of said sensing means, for providing temperature compensation for said pressurized system, wherein said electronic circuit means comprises a plurality of channels for processing the output voltages from said reference sensing means and said sensing means, and phase discrimination means for providing an output proportional to said pressure in said pressurized system.

2. The system of claim 1 wherein said sensor comprises a hollow member having an outer surface and its interior completely sealed, said sensor being constructed and arranged to permit compressional stressing of said outer surface and highly sensitive to applied pressure.

3. The system of claim 2 wherein said sealed member comprises an elongated hollow cylinder comprising a low temperature coefficient magnetostrictive material.

4. The system of claim 2 wherein said sensor comprises walls which are sufficiently thin for compressional stressing substantially at the outer surface thereof in response to the pressure of said pressurized system.

5. The sensor of claim 2 wherein said system is sealed in opposite ends thereof and comprises a hollow, thin-walled member for providing a sealed inner volume of gas at atmospheric pressure.

6. The system of claim 2 including end caps sealed to opposite ends of said sensor, said end caps comprising the same material as that of said sensor.

7. The system of claim 1 further including reference sensor means located proximate to said sensor means whereby any variations in temperature of said internal pressure within said pressurized system are compensated for and changes in sensor surface stress upon pressurization are obtained without regard for internal pressure of said system.

8. The system of claim 1 wherein said sensing means is removable relative to said housing.

9. The system of claim 1 wherein said sensor comprises a ferrite material.

* * * * *